(12) United States Patent
Mäkelä et al.

(10) Patent No.: US 8,032,330 B2
(45) Date of Patent: Oct. 4, 2011

(54) ELECTROMAGNETIC INTERFERENCE SENSOR DEVICE AND METHOD AND COMPUTER PROGRAM

(75) Inventors: Jakke Mäkelä, Turku (FI); Niko Porjo, Piikkiö (FI); Terho Kaikuranta, Piispanristi (FI); Kari Pitkäranta, Salo (FI)

(73) Assignee: Nokia Corporation, Espoo (FI)

( * ) Notice: Subject to any disclaimer, the term of this patent is extended or adjusted under 35 U.S.C. 154(b) by 702 days.

(21) Appl. No.: 12/074,952

(22) Filed: Mar. 7, 2008

(65) Prior Publication Data

US 2009/0228240 A1    Sep. 10, 2009

(51) Int. Cl.
*G06F 11/30* (2006.01)
*G21C 17/00* (2006.01)
*G01R 31/00* (2006.01)

(52) U.S. Cl. ............ 702/185; 702/58; 702/71; 702/73; 702/183; 702/189; 701/33; 324/628

(58) Field of Classification Search ............ 702/58, 702/71, 73, 183, 185, 189; 701/33; 324/628
See application file for complete search history.

(56) References Cited

U.S. PATENT DOCUMENTS

| | | | |
|---|---|---|---|
| 4,488,301 A | 12/1984 | Nasuta et al. | 371/25 |
| 4,731,586 A | 3/1988 | Perkins | 324/536 |
| 5,263,368 A | 11/1993 | Breitmeier et al. | 73/170.24 |
| 5,479,610 A | 12/1995 | Roll-Mecak et al. | 395/183.01 |
| 5,537,318 A | 7/1996 | Moses et al. | 364/420 |
| 5,541,501 A | 7/1996 | Shaver et al. | 324/72 |
| 5,935,187 A * | 8/1999 | Trsar et al. | 701/102 |
| 6,078,874 A | 6/2000 | Piety et al. | 702/122 |
| 6,232,882 B1 | 5/2001 | Hed et al. | 340/601 |
| 6,535,112 B1 | 3/2003 | Rothschink | 340/425.5 |
| 6,625,399 B1 | 9/2003 | Davis | 396/263 |
| 6,917,122 B2 | 7/2005 | May et al. | 307/9.1 |

(Continued)

FOREIGN PATENT DOCUMENTS

EP    1 468 302 B1    8/2005

(Continued)

OTHER PUBLICATIONS

"Radio Frequency" Wikipedia article [online], Feb. 27, 2008 [retrieved Mar. 20, 2009] Available on the internet: URL:http://en.wikipedia.org/w/index.php?title+Radio_frequency&oldid=194335938.

*Primary Examiner* — Mohamed Charioui
*Assistant Examiner* — Janet Suglo
(74) *Attorney, Agent, or Firm* — Harrington & Smith (57) ABSTRACT

A portable diagnostic apparatus is brought proximal to a device to be diagnosed. While the device to be diagnosed is operating, a radiofrequency interference signal emitted by the device is received at the portable apparatus and a data representation of it is stored. The data representation is submitted for matching to a diagnostic signal pattern stored in a database of predetermined signal patterns. From the matching is identified and output an indication of a fault in the device to be diagnosed. In one embodiment the submitting is to the database stored in the portable apparatus itself, and in another embodiment the submitting is outputting (data cable, wireless link) the stored data representation to a diagnostic computer such as a personal computer, a peer device, or a remote diagnostic center. The RF interference signal may be one stream and the portable apparatus receives at least a second stream and both streams are used for the matching.

19 Claims, 5 Drawing Sheets

U.S. PATENT DOCUMENTS

| | | | |
|---|---|---|---|
| 6,943,699 B2 | 9/2005 | Ziarno | 340/945 |
| 6,956,501 B2 | 10/2005 | Kitson | 340/870.07 |
| 7,254,484 B2 | 8/2007 | Jantunen et al. | 702/4 |
| 7,577,535 B2* | 8/2009 | Anderson et al. | 702/62 |
| 7,613,576 B2* | 11/2009 | Gross et al. | 702/57 |
| 7,627,406 B2* | 12/2009 | Wang et al. | 701/33 |
| 2004/0230385 A1 | 11/2004 | Bechhoefer et al. | 702/57 |
| 2005/0021294 A1* | 1/2005 | Trsar et al. | 702/183 |
| 2005/0075843 A1 | 4/2005 | Michiwaki et al. | 702/188 |
| 2005/0197070 A1 | 9/2005 | Kaikuranta et al. | 455/67.13 |
| 2005/0258971 A1 | 11/2005 | Greenstein et al. | 340/601 |
| 2006/0099971 A1 | 5/2006 | Staton et al. | 455/456.6 |
| 2006/0271312 A1 | 11/2006 | Hayes et al. | 702/60 |
| 2007/0038402 A1 | 2/2007 | Zhang | 702/117 |

FOREIGN PATENT DOCUMENTS

| | | |
|---|---|---|
| GB | 2 329 943 A | 4/1999 |
| WO | WO 01/41417 A1 | 6/2001 |

* cited by examiner

| | |
|---|---|
| EMI FAULT SIGNAL 1 | FAULT CODE 02347 (TIMING ADVANCE) |
| EMI FAULT SIGNAL 2 | FAULT CODE 18953 (TRANSMISSION SHIFT RELAY) |
| EMI FAULT SIGNAL 3 | FAULT CODE 00534 (COLD AIR INTAKE ADJUST) |
| EMI FAULT SIGNAL 4 | FAULT CODE 39703 (FUEL METERING VALVE RELAY) |
| EMI FAULT SIGNAL 5 | FAULT CODE 02558 (ALTERNATOR CUTOUT VOLTAGE) |
| EMI FAULT SIGNAL 6 | FAULT CODE 29444 (WATER PRESSURE RELAY) |

ELECTROMAGNETIC INTERFERENCE SENSOR DEVICE AND METHOD AND COMPUTER PROGRAM

TECHNICAL FIELD

The teachings herein relate generally to sensing electromagnetic interference from an electronic device and diagnosing malfunctions therefrom.

BACKGROUND

In new consumer electronics devices, there are increasingly larger arrays of sensors for monitoring the performance and functionality of the device and making diagnostic decisions. Automobiles are perhaps the most advanced in this area. Though not traditionally retail consumer items, aircraft and elevators and escalators have been developed in the past decade with a substantial number of sensors built into them so as to better diagnose problems in their operation. The additional cost of manufacturing due to the added sensors is generally seen by the manufacturers as more than offset by more reliable performance (the sensors aid in anticipating problems before they become large enough to cause major failure), decreased down time due to faster and more accurate diagnostics, and a more competitive position for the original manufacturer to secure long term maintenance contracts for the equipment it originally sold.

However, this trend toward sensorification is not proceeding as quickly in lesser-value manufactured goods, and the vast majority of other consumer electronics with engines still do not have very many diagnostic sensors if any at all. Much like auto repair was routinely done a generation or two ago in what are now more developed countries, today there is a lack of highly specialized diagnostic equipment for auto repair in lesser developed countries. Sometimes even rudimentary electronic diagnostics like an engine analyzer or a timing light are unavailable. Cars being repaired are older on average than those being serviced in more developed countries, and even if they did include the inbuilt diagnostic sensors noted above there is no electronic equipment to extract and exploit that information. This less refined diagnostic process is likely to persist for some years even in the face of favorable conditions of economic growth across the local populace. The problem is not limited only to the automobile repair industry though.

Further, in more developed countries there is a concerted effort to make various devices electromagnetically compatible, such that one device does not cause electromagnetic interference EMI with other common devices. This can be seen readily in portable or auto-mounted radios. In the past EMI between an AM radio and a cellular phone was an issue, whereas largely that problem has been solved and there is no need to turn off an AM radio when communicating on a cellular phone. In less developed countries EMI has not been an historic problem and so devices there are not prone to such EMI compatibility as they are in areas where electronics have become more ubiquitous.

What is needed in the art is a way to remotely diagnose products in less developed areas of the world, as well as lower-value consumer devices that do not have in-built sensors similar to those currently used in high-cost manufactured items such as automobiles, aircraft and elevators/escalators. It would be advantageous to address this diagnostic problem in a manner that does not require a high capital investment in diagnostic equipment. The lower cost and relatively lower complexity of the vast majority of electronic devices that are directed to the retail purchaser/end user generally does not justify having such an array of sensors built into the manufactured device, yet the complexities are high enough that diagnosing a problem can be time consuming and expensive. For this reason especially in the developed world many consumer electronics are deemed more 'disposable' than need be, because often the cost of diagnosis is high enough to make diagnosis and repair an uneconomical option. An economical solution to the diagnostic problem would change the balance of the questions whether to repair or replace a malfunctioning device.

SUMMARY

In accordance with one exemplary embodiment of the invention is a method that includes receiving a radiofrequency interference signal that is emitted by a device to be diagnosed, then storing a data representative of the received interference signal at a portable apparatus that is separate from the device to be diagnosed, submitting the stored data that is representative of the received interference signal for matching to a diagnostic signal pattern stored in a database of predetermined diagnostic signal patterns, and from the matching, outputting an indication of a fault that is identified in the device to be diagnosed. In one embodiment the submitting is to the database stored in the portable apparatus, and in another embodiment the submitting is outputting the stored interference signal to a diagnostic computer such as a personal computer, a peer device, or a remote diagnostic center.

In accordance with another exemplary embodiment of the invention is an apparatus that includes a receiver, a memory, and either a processor or an output port. The receiver is configured to receive a radiofrequency interference signal that is emitted by a device to be diagnosed. The memory is configured to store data representative of the received interference signal. For the case where this embodiment includes the processor, the processor is configured to match the stored data that is representative of the received interference signal for matching to a diagnostic signal pattern of a database of predetermined diagnostic signal patterns that is stored in the memory so as to identify from the interference signal a fault in the device to be diagnosed. For the case where this embodiment includes the output port, the output port is for sending the data that is representative of the received interference signal to a separate diagnostic computer for matching to a diagnostic signal pattern, and specific embodiments of the output port include a data port for a cable, a low power transmitter such as Bluetooth for communicating on a piconetwork, an infrared transmitter for submitting the data via an infrared IR line of sight link, or a cellular or WLAN transmitter which submits the data via a larger wireless network such as cellular or wireless local area network WLAN.

In accordance with another exemplary embodiment of the invention is a memory embodying a program of machine readable instructions, executable by a processor for taking actions directed toward diagnosing a fault in a device to be diagnosed. In this embodiment the actions include receiving a radiofrequency interference signal that is emitted by a device to be diagnosed, storing data representative of the received interference signal at a portable apparatus, and submitting the stored data that is representative of the interference signal for matching to a diagnostic signal pattern stored in a database of predetermined diagnostic signal patterns. The actions further include outputting an indication of fault in the device to be diagnosed that is identified from the matching.

In accordance with still another exemplary embodiment of the invention is an apparatus that includes receive means, memory means, and means for submitting. The receive means (e.g., a cellular or other radio receiver) is for receiving a radiofrequency interference signal that is emitted by a device to be diagnosed. The memory means (e.g., a local computer readable memory) is for storing data representative of the interference signal. And the means for submitting is for submitting the data that is representative of the interference signal for matching to a diagnostic signal pattern stored in a database of predetermined diagnostic signal patterns so as to identify from the interference signal a fault in the device to be diagnosed. Various embodiments of the means for submitting are noted above and detailed below.

These and other aspects of the invention are detailed more particularly below.

BRIEF DESCRIPTION OF THE DRAWINGS

The foregoing and other aspects of these teachings are made more evident in the following Detailed Description, when read in conjunction with the attached Drawing Figures.

DETAILED DESCRIPTION

Embodiments of this invention employ a RF-enabled receiver in a mobile device such as a mobile station (e.g., a portable cellular radiotelephone) to wirelessly detect and diagnose possible malfunctions in various engines, for example car engines or other electromechanical devices. The idea is particularly advantageous for people who do not have sufficient money for expensive diagnostic devices, but who can afford a phone. It is also useful to change the economic balance between repair or replace a malfunctioning electronic device (e.g., microwave oven) because it is seen to drastically reduce diagnostic costs.

In one exemplary implementation the end user brings his/her mobile phone proximal to the other device being diagnosed, and the phone then receives a radiofrequency RF interference signal that is emitted from the device being diagnosed. The phone stores the interference signal, and it is compared to a database of known EMI signals in order to determine the cause of the fault. Proximal as used herein indicates a functional distance, one in which the receiver can receive the interference signal emitted by the device to be diagnosed. Generally, three feet or closer is a good approximation of proximal, but it may be precisely defined on a functional basis depending on the frequency of the signal, noise in the air interface, etc. The comparing may be within the phone itself, or the phone may send the stored interference signal to a diagnostic computer. The diagnostic computer may be for example a nearby personal computer PC with software and a database arranged for this purpose, or it may be submitted (e.g. via a cellular call) to a remotely located diagnostic center such as may be operated by the manufacturer of the malfunctioning device.

As above, there are two different embodiments of how a fault may be identified from the interference signal. In one, the user uploads the stored interference signal to a diagnostic service, either wirelessly from the phone or wired to a personal computer (which may have locally stored software to do the diagnostic service itself), and informs the diagnostic service of the device being diagnosed (e.g., make, model, year, etc.). In the other, the diagnostics are done in the phone itself, such as using audio signal processing that the phone normally does for signals that it receives in the normal course of phone audio reception (or specialized software can be employed such as for very particularized diagnostic purposes).

Whether at the separate diagnostic computer or at the mobile phone itself, there is a database stored of predetermined diagnostic signal patterns, and the interference signal is matched to one of them within some confidence level. From the match a fault is identified and an indication of that fault is output to the user. In this manner the diagnostic process uses electromagnetic interference EMI but does not rely on a sensor inbuilt into the device being diagnosed. The above interference signal represents one stream that can be matched against the database; multiple streams can be used for better accuracy and to more precisely conclude a single fault error code from the multiple matches. For example, often there is an audio interference signal also, which can also be received at a microphone of the mobile phone and stored for matching against the database as a second stream.

The device being diagnosed can be an automobile, a refrigerator, a microwave oven, or any of a host of consumer electronic devices. Malfunctions are readily detectable from such devices that have a mechanical motor (as most motors in today's consumer electronics devices have substantial electronic controls) or a high-current electric motor such as the examples above, and these devices are seen as the most likely to benefit from the remote and wireless sensing diagnostic approach detailed herein. A great deal of diagnostic information could be gained by remote detection of the electromagnetic interference from malfunctioning parts of the engine. As a concrete example, it is very difficult to know whether the spark plugs in an automobile motor are synchronized. However, synchronization errors could be heard in the EMI signal (for example by placing an AM radio close to the engine and processing the data).

Figure 1A:
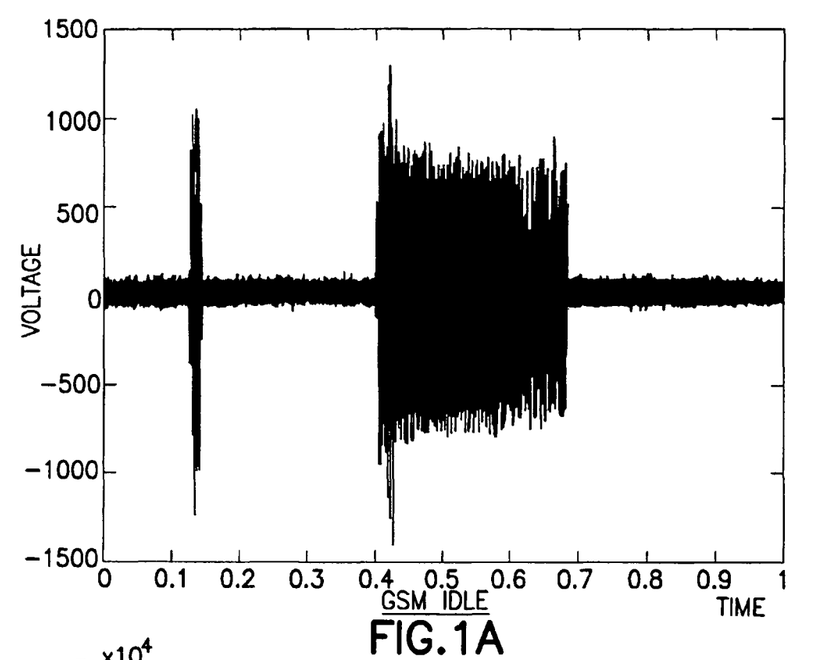
FIGS. 1A-C are voltage versus time profiles of known RF signals spanning one second, which may be stored in a portable device or at a remote diagnostic database, and cross referenced according to an embodiment of the invention.
Figure 1B:
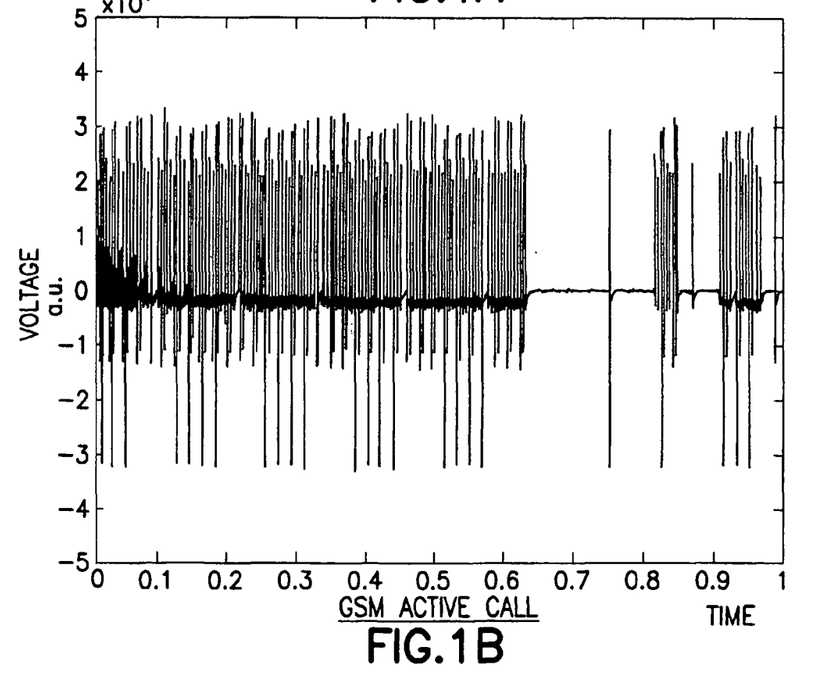
Figure 1C:
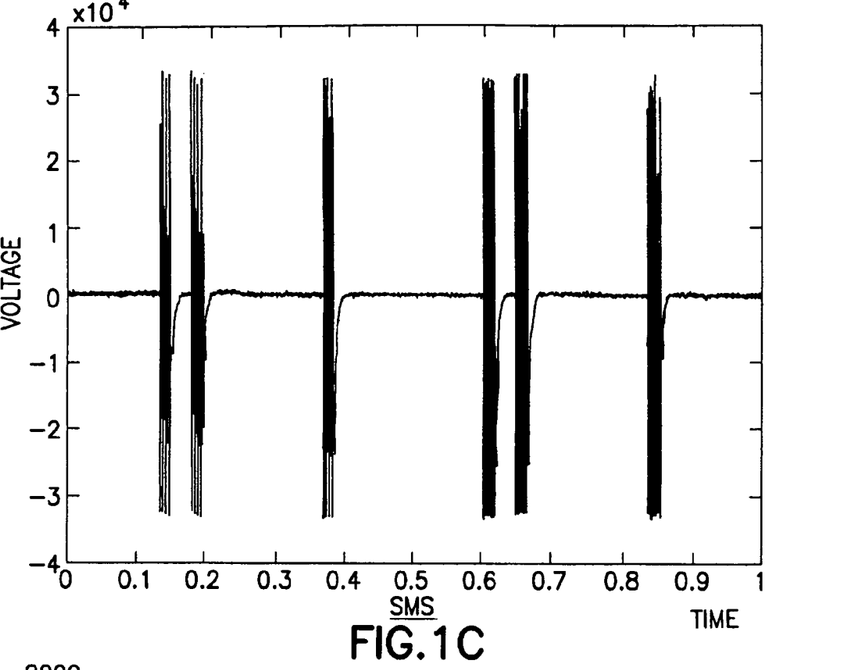

FIGS. 1A-1C show three different signal profiles of known RF signals that may be stored in the database according to these teachings, specific for a GSM (global system for mobile communications) system. Of course larger databases provide a more comprehensive diagnostic capability, but the three profiles of FIGS. 1A-1C suffice for explaining the concept. FIG. 1A is a GSM idle profile; FIG. 1B is a GSM active call, and FIG. 1C is a SMS (short message service) message on a GSM system. According to an embodiment of the invention, one brings a mobile phone in close proximity to the engine or electronic device to be analyzed/diagnosed and reads the signal shown by example at FIG. 1D, which is the interference signal emitted by the device being diagnosed and received at the diagnostic device/mobile station. This is compared to the diagnostic signal patterns stored in the memory. While it can be seen that there is somewhat of a match to the GSM idle signal of FIG. 1A, ideally the diagnostic database would have some match to the profile of FIG. 1D which identifies a specific fault in the malfunctioning device. The differences between the profile of a true GSM idle signal at FIG. 1A and the profile of the received interference signal at FIG. 1D can be used to electronically isolate a fault in the engine/device that was proximal to the phone receiver when the interference signal of FIG. 1D was received. Theoretically, there is one most likely cause of an interference that results in the signal profile FIG. 1D. Due to the similarities to FIG. 1A, it may be that the interference signal actually emitted by the malfunctioning device canceled those portions of the FIG. 1A profile that are not present in FIG. 1D. In other instances, the entire received interference signal may be considered as indicative of the fault itself.

The granularity as to how precisely the fault is identified is closely related to the size of the database and the number and variety of received interference signals that are processed. The received interference signal may be passive, in that the mobile phone does not send out a test signal but simply receives electronic signals that are generated intrinsically by the device being diagnosed. The RF receiver of the diagnostic device/mobile station is tuned to a particular frequency range where preferably no normal communications are expected (e.g., near or less than 1 MHz) and listens. It may be that the diagnostic database identifies the frequency range for a particular type of device being diagnosed, but in a simple implementation the mobile station simply listens for the interference signal.

Figure 1D:
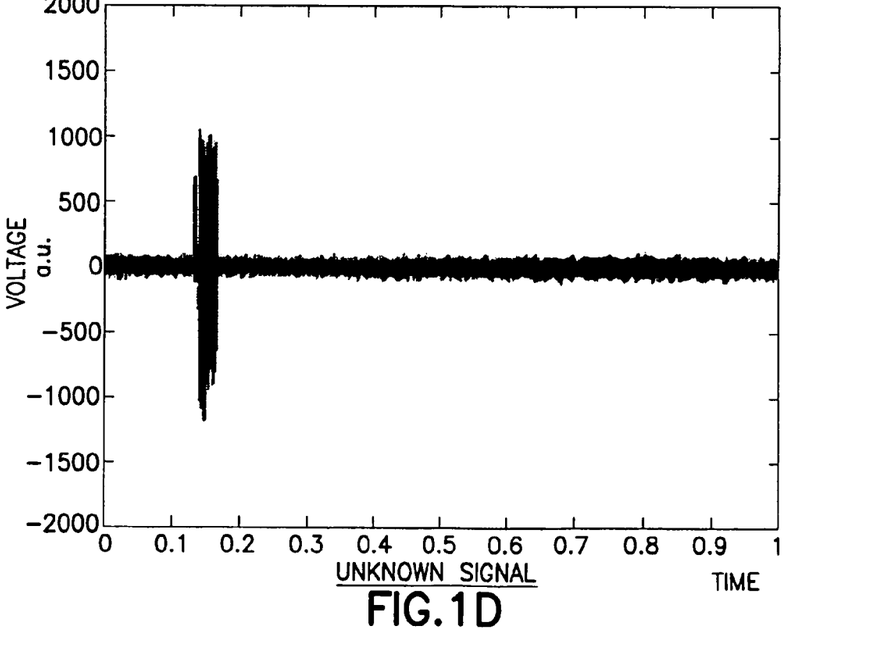
FIG. 1D is a voltage versus time profile of an interfered RF signal also spanning one second that is compared to a bank of stored signals such as those of FIGS. 1A-C for engine fault diagnosis according to an embodiment of the invention.

For the case of FIG. 1D, a GSM mobile phone is brought into close proximity to the engine or electronic device to be analyzed/diagnosed, and receives the interference signal shown there which is generated by the device being diagnosed. The database against which this received interference signal is compared will have multiple signal profiles that represent various faults that are previously identified for the device being diagnosed, and such databases may be developed by the manufacturer of the malfunctioning device or by third parties. The received profile (FIG. 1D) is compared to the database of EMI faults and a match is found between the received interference signal and a known EMI fault signal.

Figure 2:
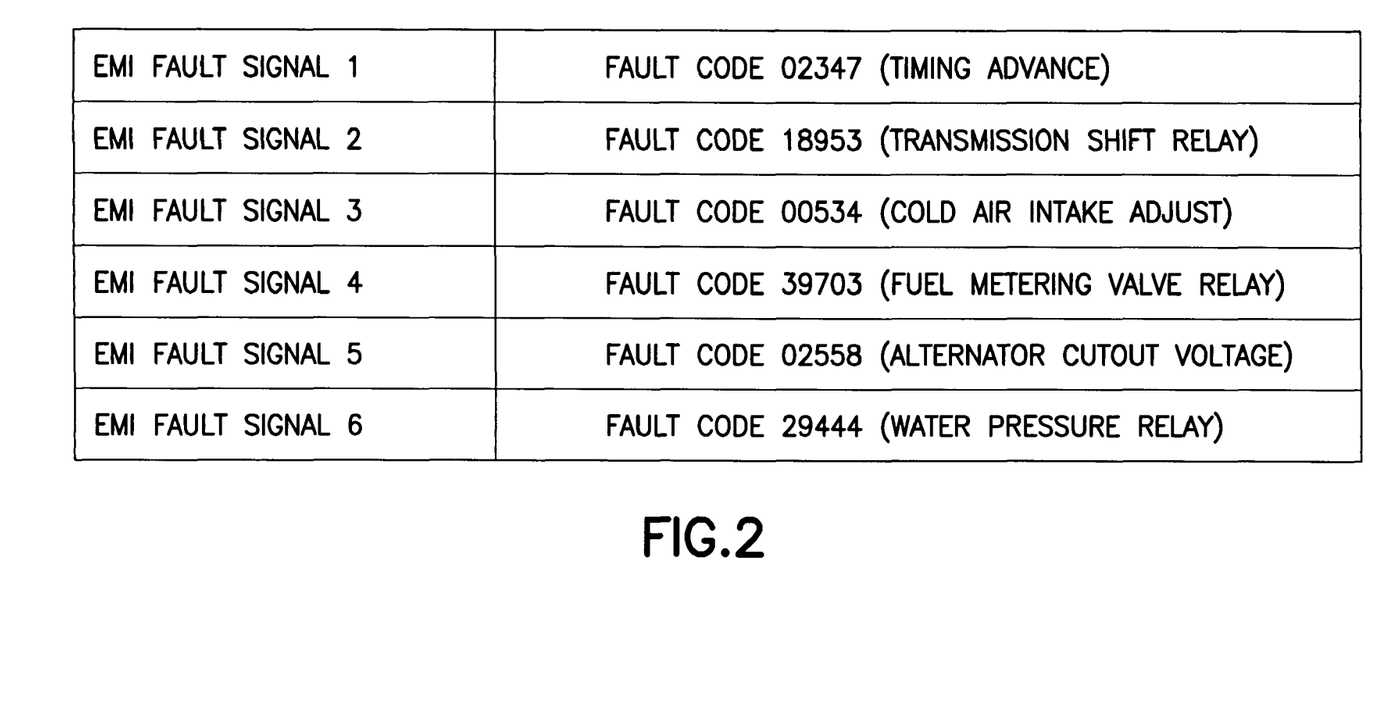
FIG. 2 is a schematic diagram of a database associating various known interference signals with specific fault identifications.

That match (from a single stream such as an interference RF signal or a plurality of streams as detailed below) identifies the fault or at least identifies one of several discrete possible faults to aid the technician in finding the underlying malfunction. The known EMI signals in the database are associated with a known fault as shown by example at FIG. 2, a table showing different faults for each of several different known (predetermined) interference signals. The fault codes may match those used by a manufacturer of the apparatus being diagnosed, or may be organic to the informational databases developed specifically in support of embodiments of this invention. The shown codes and text identifiers are exemplary only. The difference profiles may be from one or a plurality of interference signal streams. The received interference signal may be organically generated by the device being diagnosed rather than an interference with an actively transmitted test signal from the diagnostic device/mobile station.

As noted above, the RF interference signal is one exemplary stream that can be used for diagnostic purposes, and likely the most robust for diagnostic purposes. Generally, it is seen that low frequencies (below traditional cellular frequencies) are preferable since there is less potential to interfere with existing telecommunication signals, which are present in both the developed and lesser developed areas of the world though in different volumes. Other streams may be used in addition to the received RF interference signal to provide further information to isolate the fault. For example, another stream may be audio received at the microphone of the mobile station; another stream may be a vibration detected by an accelerometer of the mobile station (which can be recorded when the mobile station is held in contact with the malfunctioning device); another stream may be an optical signal received by a camera or other optical sensor of the mobile station. Another possible second stream is another RF interference signal received at a different frequency than the first; different error states in the malfunctioning device will sometimes cause EMI disturbances at different frequencies.

Figure 3:
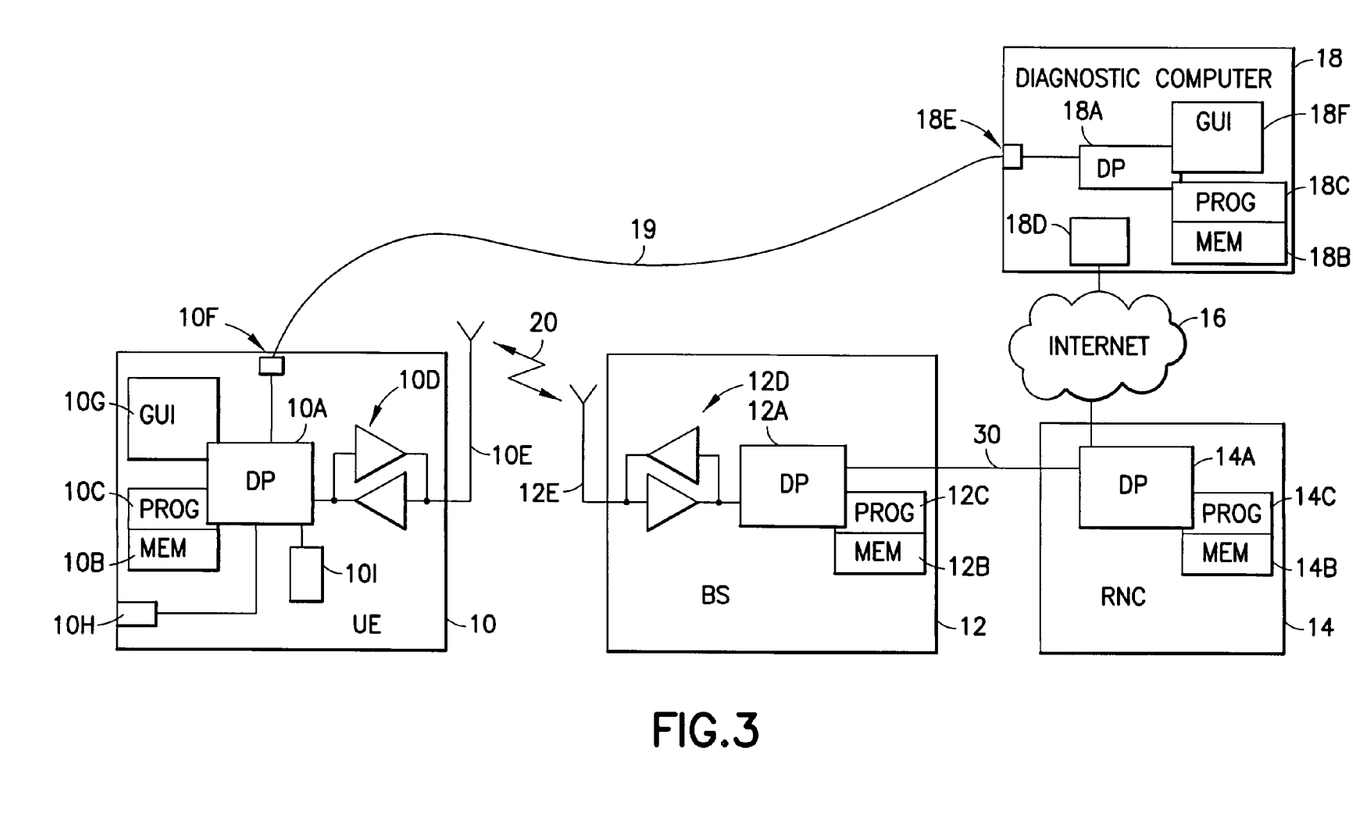
FIG. 3 is a schematic diagram of a hand portable device according to an embodiment of the invention that can provide interference signal information to a diagnostic computer via a local connection of through a wireless cellular system/internet.

FIG. 3 is a simplified block diagram illustrating a mobile station that may be used to implement an embodiment of the invention. In FIG. 3 a wireless network includes a base station BS 12 and a radio network controller RNC 14 adapted for communication with a user equipment UE 10. The RNC may be embodied as a gateway GW/serving mobility entity MME/radio network controller RNC or other radio controller function known by various terms in different wireless communication systems. The UE 10 includes a data processor (DP) 10A, a memory (MEM) 10B that stores a program (PROG) 10C, and a suitable radio frequency (RF) transceiver 10D coupled to one or more antennas 10E (one shown) for bidirectional wireless communications over one or more wireless links 20 with the Node B 12. The UE 10 also includes a local data port 10F and a graphical user interface GUI 10G such as for example a flat panel display for showing a specific fault identification to the user. The data port 10F and the transmitter of the transceiver 10D (whether cellular, Bluetooth, or IR) may be generically termed an output port for sending the information about the received interference signal to the external diagnostic computer. For receiving a second stream interference signal, the UE 10 may include an optical sensor (e.g., camera) 10H and/or an accelerometer (e.g., laser and sensor along one or more axes) 10I that provide their input signal to the DP 10A for processing and storing in the MEM 10B.

The terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and printed electrical connections, as well as by the use of electromagnetic energy, such as electromagnetic energy having wavelengths in the radio frequency region, the microwave region and the optical (both visible and invisible) region, as non-limiting examples.

The BS 12 may be a NodeB, e-NodeB, an access node of a wireless local area network, or any other such access nodes known by various terms for different wireless communication systems. The BS 12 includes a DP 12A, a MEM 12B, that stores a PROG 12C, and a suitable RF transceiver 12D coupled to one or more antennas 12E. The GW/MME/RNC 14 includes a DP 14A, a MEM 14B that stores a PROG 14C, and a suitable modem and/or transceiver (not shown) for communication with the Node B 12 over the Iub link 30. The BS 12 may be coupled via a data path 30 (e.g., Iub or S1 interface) to the serving or other GW/MME/RNC 14 which is coupled to the internet 16, or for example in the case of a WLAN the entity in the position of the BS 12 may be directly coupled to the internet 16.

While in some embodiments the database and pattern matching of the received interference signal to the diagnostic database is done wholly within the portable apparatus shown in FIG. 3 as the UE 10, in other embodiments the UE 10 provides information about the received interference signal (which may be the entire interference signal itself or some compression or other data representation of it) to a diagnostic computer 18. The diagnostic computer 18 may be a personal computer to which the information is provided via a local link 19 (e.g., data cable, Bluetooth, infrared, etc.) or a remote diagnostic center to which the information is provided through the Internet 16 such as via a WLAN or cellular from the UE 10. The diagnostic computer 18 includes a DP 18A, a MEM 18B that stores a PROG 18C, and a suitable modem 18D and/or data port 18E for communication with a similar data port 10F of the UE 10 over any of the various exemplary but non-limiting pathways indicated, whether hardwired or wireless or some combination. The diagnostic computer 18 may also include a graphical user interface GUI 18F for displaying data such as fault identifications to the user.

At least one of the PROGs 10C, 18C is assumed to include program instructions that, when executed by the associated DP, enable the electronic device to operate in accordance with the exemplary embodiments of this invention, as detailed above. The PROGs 10C, 18C may be embodied in software, firmware and/or hardware, as is appropriate. In general, the exemplary embodiments of this invention may be implemented by computer software stored in the MEM 10B and executable by the DP 10A of the UE 10 and similar in part for the other MEM 18B and DP 18A of the diagnostic computer for the embodiments where the UE 10 does not do the pattern matching, or by hardware, or by a combination of software and/or firmware and hardware in any or all of the devices shown.

In general, the various embodiments of the UE 10 can include, but are not limited to, mobile stations, cellular telephones, personal digital assistants (PDAs) having wireless communication capabilities, portable computers having wireless communication capabilities, gaming devices having wireless communication capabilities, Internet appliances permitting wireless Internet access and browsing, as well as portable units or terminals that incorporate combinations of such functions. The various embodiments of the diagnostic computer 18 may include a desktop or laptop or palmtop personal computer, a wearable personal computer, as well as a mainframe computer at a remote location, to name a few.

The MEMs 10B and 18B may be of any type suitable to the local technical environment and may be implemented using any suitable data storage technology, such as semiconductor-based memory devices, magnetic memory devices and systems, optical memory devices and systems, fixed memory and removable memory. The DPs 10A and 18A may be of any type suitable to the local technical environment, and may include one or more of general purpose computers, special purpose computers, microprocessors, digital signal processors (DSPS) and processors based on a multi-core processor architecture, as non-limiting examples.

For the aspects of this invention related to the UE 10, embodiments of this invention may be implemented by computer software executable by a data processor of the UE 10, such as the processor 10A shown, or by hardware, or by a combination of software and hardware. For the aspects of this invention related to the diagnostic computer, embodiments of this invention may be implemented by computer software executable by a data processor of the diagnostic computer 18, such as the processor 18A shown, or by hardware, or by a combination of software and hardware. Further in this regard it should be noted that the various logical step descriptions above and in FIG. 4 below may represent program steps, or interconnected logic circuits, blocks and functions, or a combination of program steps and logic circuits, blocks and functions.

In general, the various embodiments may be implemented in hardware or special purpose circuits, software (computer readable instructions embodied on a computer readable medium), logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate. The individual block so FIG. 4 may be considered as functional circuitry of such an integrated circuit device.

Figure 4:
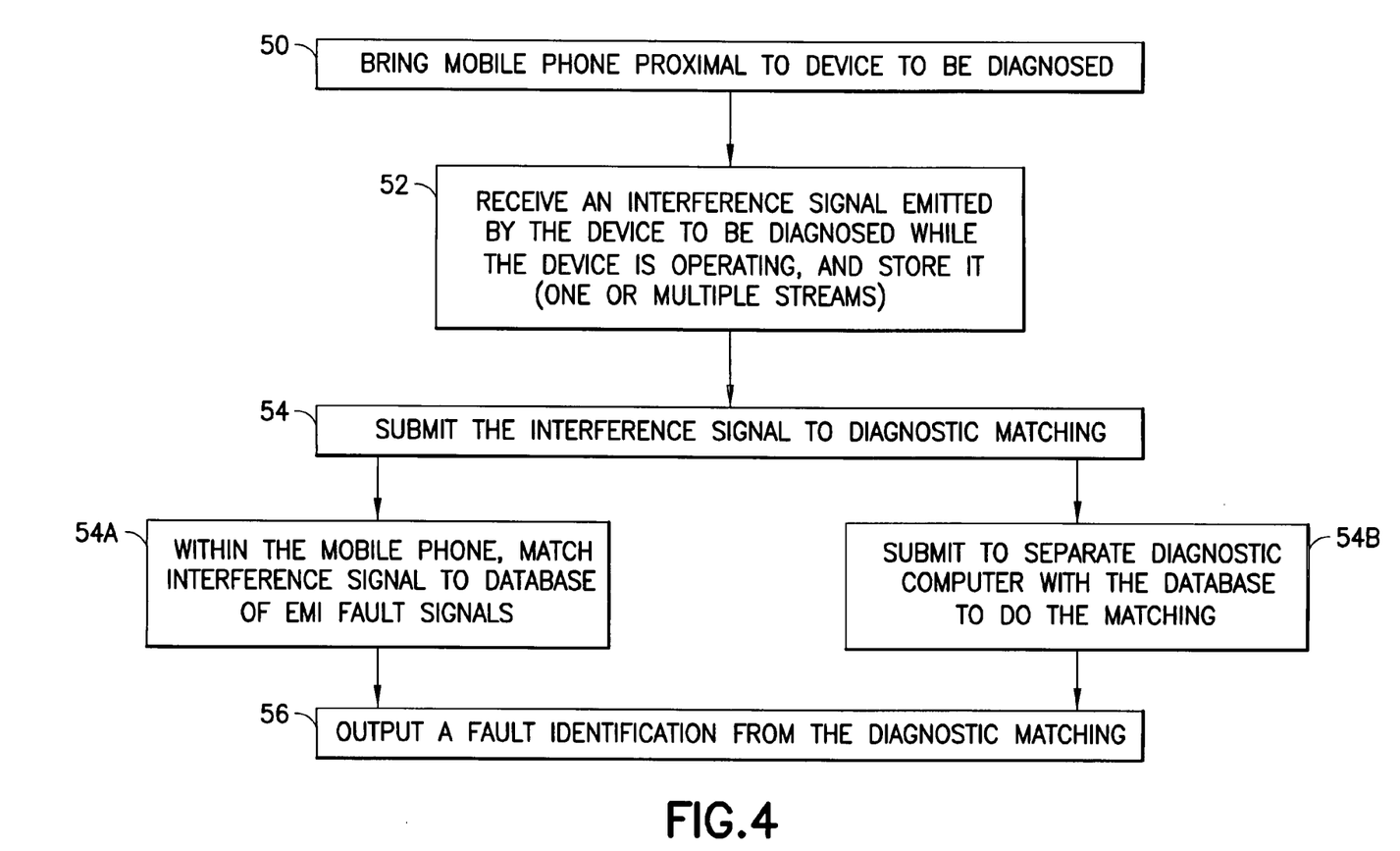
FIG. 4 is a process flow diagram according to an embodiment of the invention.

FIG. 4 illustrates process steps according to two different embodiments of the invention: pattern matching within the portable device that receives the interfered signal, and pattern matching at a separate diagnostic computer. At block 50 the user equipment 10 is brought proximal to the device to be diagnosed. At block 52 the UE 10 receives an interference signal emitted by the device to be diagnosed and stores it. As above, this may be one stream of information or multiple streams of information, of which some streams may not be received at the mobile station as an RF interference signal. At block 54 the stored interference signal being submitted for pattern matching to the database of EMI fault signals. For the embodiment wherein the UE 10 does the pattern matching within itself, block 54A shows the result of that pattern matching and the UE 10 itself finds the fault identification from pattern matching against the database of EMI fault signals stored within the UE 10 itself, which the UE 10 outputs at block 58.

For the embodiments where the information about the stored interference signal is submitted to a separate diagnostic computer 18 at block 54B, the information about the received interference signal (one or more streams) may be uploaded to a local PC that stores the database of EMI fault signals or sent (e.g., via cellular signal) to a remote diagnostic center such as may be operated by the manufacturer. In either case, the diagnostic computer identifies from its own pattern matching a single fault for which the fault identification is output at block 58. That fault identification may be communicated back to the UE 10 and output on a graphical user interface of the UE 10, or it may be output on a graphical user interface of the diagnostic computer 18 for the case where the local link 19 is used to communicate between the local computer and the UE 10.

In yet another embodiment, the stored interference signal may be sent to another portable device (e.g., another mobile phone) which has the database of AMI fault signals. Such peer-to-peer sharing can be employed where one portable apparatus has the database and other mobile phones gather interference signals from various repair shops, and the faults from the devices to be diagnosed at the various repair shops are sent to the portable apparatus with the database. This saves memory volume in that not every apparatus used for sensing/receiving the interference signals stores the entire database, but it remains available for the community. In this respect the peer-to-peer sharing is similar to the sensing/receiving mobile phone sending its stored interference signal to the locally-based personal computer for diagnostic matching over a wireless IR or WLAN link. Because that portable mobile phone/apparatus having the database is also a computing device, it falls within the generic term separate diagnostic computer.

Various modifications and adaptations may become apparent to those skilled in the relevant arts in view of the foregoing description, when read in conjunction with the accompanying drawings. However, any and all modifications of the teachings of this invention will still fall within the scope of the non-limiting embodiments of this invention.

Although described in the context of particular embodiments, it will be apparent to those skilled in the art that a number of modifications and various changes to these teachings may occur. Thus, while the invention has been particularly shown and described with respect to one or more embodiments thereof, it will be understood by those skilled in the art that certain modifications or changes may be made therein without departing from the scope of the invention as set forth above, or from the scope of the ensuing claims.

We claim:

1. A method comprising:
   receiving at a portable apparatus a radiofrequency interference signal which comprises a radiofrequency signal emitted by a device to be diagnosed as interfered by another signal transmitted from the portable apparatus;
   storing data representative of the received interference signal in the portable apparatus separate from the device to be diagnosed;
   submitting information identifying the device and the stored data representative of the received interference signal for matching to a diagnostic signal pattern stored in a database of predetermined diagnostic signal patterns; and
   from the matching, the portable apparatus outputting an indication of fault that is identified in the device to be diagnosed.

2. The method of claim 1, wherein the interference signal comprises a first stream interference signal and there is further received at the portable apparatus a second stream interference signal from the device to be diagnosed, and in which the stored data is representative of the radiofrequency interference signal and of the second stream interference signal, in which the second stream interference signal comprises an audio signal received at a microphone of the apparatus.

3. The method of claim 1, wherein the interference signal comprises a first stream interference signal and there is further received at the portable apparatus a second stream interference signal from the device to be diagnosed, and in which the stored data is representative of the radiofrequency interference signal and of the second stream interference signal, in which the second stream interference signal comprises a vibration received at an accelerometer of the portable apparatus.

4. The method of claim 1, wherein submitting comprises sending to a separate diagnostic computer which does the matching, the method further comprising receiving at the portable apparatus from the separate diagnostic computer the identified fault.

5. The method of claim 1, in which the device comprises a mechanical motor.

6. The method of claim 5, in which the device comprises an automobile and the information identifying the device comprises at least make, model and year.

7. The method of claim 1, in which the another signal comprises a test signal.

8. A method comprising:
   receiving at a portable apparatus a radiofrequency interference signal emitted from a device to be diagnosed;
   storing data representative of the received interference signal in the portable apparatus separate from the device to be diagnosed;
   submitting information identifying the device and the stored data representative of the received interference signal for matching to a diagnostic signal pattern stored in a database of predetermined diagnostic signal patterns; and
   from the matching, the portable apparatus outputting an indication of fault that is identified in the device to be diagnosed;
   wherein the portable apparatus comprises a portable radio, the method further comprising the initial step of bringing the portable radio within approximately three feet of the device to be diagnosed.

9. The method of claim 8, wherein the portable radio comprises a mobile telephone.

10. The method of claim 8, wherein the matching is done by the portable radio, the database of predetermined diagnostic signal patterns is stored in a local memory of the portable radio, and the predetermined diagnostic signal patterns used for the matching is specific for the device as identified by the information.

11. An apparatus comprising:
    at least one memory storing computer program code; and
    at least one processor; in which the at least one memory with the computer program code is configured with the at least one processor to cause the apparatus at least to:
    store data representative of an interference signal emitted from a device to be diagnosed, in which the interference signal comprises a radiofrequency signal emitted by the device to be diagnosed as interfered by another signal transmitted from the apparatus; and one of
    use information identifying the device to match the stored data representative of the interference signal to a diagnostic signal pattern of a database of predetermined diagnostic signal patterns stored in the at least one memory so as to identify from the interference signal a fault in the device to be diagnosed, or send via an output port the information identifying the device and the data representative of the interference signal to a separate diagnostic computer for matching to a diagnostic signal pattern.

12. The apparatus of claim 11, wherein the interference signal comprises a first stream interference signal and there is further a second stream interference signal from the device to be diagnosed;
    and in which the stored data is representative of the radiofrequency interference signal and of the second stream interference signal, in which the second stream interference signal comprises an audio signal received at a microphone of the apparatus.

13. The apparatus of claim 11, wherein the interference signal comprises a first stream interference signal and there is further a second stream interference signal from the device to be diagnosed, and in which the stored data is representative of the radiofrequency interference signal and of the second stream interference signal, in which the second stream interference signal comprises a vibration received at an accelerometer of the apparatus.

14. The apparatus of claim 11, wherein the apparatus comprises the output port and wherein the output port comprises one of a data port for a data cable and a transmitter configured to output the interference signal to the separate diagnostic computer which does the matching.

15. The apparatus of claim 14, wherein the output port comprises one of a data port for sending the interference signal over a cable connection, a low power transmitter for sending the interference signal over a piconetwork, or an infrared transmitter for sending the interference signal via an infrared channel.

16. The apparatus of claim 14, wherein the output port comprises a transmitter configured for sending the interference signal to the separate diagnostic computer via a wireless communications network.

17. The apparatus of claim 11, wherein the apparatus comprises a handheld mobile telephone and the at least one processor is configured to process the received interference signal as a received audio signal.

18. The apparatus of claim 11, in which the device comprises an automobile and the information identifying the device comprises at least make, model and year.

19. The apparatus of claim 11, in which the another signal comprises a test signal.

* * * * *